United States Patent [19]

Inayoshi et al.

[11] 4,271,424

[45] Jun. 2, 1981

[54] ELECTRICAL CONTACT CONNECTED WITH A SEMICONDUCTOR REGION WHICH IS SHORT CIRCUITED WITH THE SUBSTRATE THROUGH SAID REGION

[75] Inventors: Katsuyuki Inayoshi, Hiyoshi; Kazutoshi Miyao, Edamachi, both of Japan

[73] Assignee: Fujitsu Limited, Tokyo, Japan

[21] Appl. No.: 146,220

[22] Filed: May 5, 1980

Related U.S. Application Data

[63] Continuation of Ser. No. 913,860, Jun. 8, 1978, abandoned.

[30] Foreign Application Priority Data

Jun. 9, 1977 [JP] Japan .................. 52/68135

[51] Int. Cl.³ .................. H01L 23/48; H01L 29/46; H01L 29/62
[52] U.S. Cl. .................. 357/67; 357/59; 357/68; 357/71; 357/51; 357/86; 357/23
[58] Field of Search .................. 357/59, 65, 67, 68, 357/71, 51, 86

[56] References Cited

U.S. PATENT DOCUMENTS

| | | | |
|---|---|---|---|
| 3,280,392 | 10/1966 | Benda | 357/86 |
| 3,297,921 | 1/1967 | Topas et al. | 357/86 |
| 3,531,733 | 9/1970 | Haines | 357/68 |
| 3,539,880 | 11/1970 | Squire et al. | 357/68 |
| 3,622,419 | 11/1971 | London | 357/72 |
| 3,629,669 | 12/1971 | Kauppila | 357/68 |
| 3,632,436 | 1/1972 | Denning | 357/59 |
| 3,881,242 | 5/1975 | Nuttall et al. | 357/59 |
| 3,979,767 | 9/1976 | Nakata et al. | 357/67 |
| 4,080,616 | 3/1978 | Horie | 357/51 |
| 4,097,887 | 6/1978 | Kalkbrenner | 357/86 |

*Primary Examiner*—Andrew J. James
*Attorney, Agent, or Firm*—Staas and Halsey

[57] ABSTRACT

Disclosed herein is an improvement for the electrode structure of the MIS type semiconductor integrated circuit, in which the ohmic contact with the Si substrate is formed on the top of the semiconductor chip. The electrodes which consist of an upper Al layer and a lower polycrystalline Si layer are used for a drain electrode and a source electrode. These electrodes should be isolated from the substrate by the underlying PN junction. Another electrode, for connecting to the substrate consists of an Al layer directly in contact with the underlying N type region and which is short circuited with the substrate through the N type region due to the alloy formation between the Al and the substrate material. An MIS type semiconductor device with a grounded substrate or with a back gate bias is obtained in a simple structure by the improved source and drain electrode structure.

25 Claims, 9 Drawing Figures

ELECTRICAL CONTACT CONNECTED WITH A SEMICONDUCTOR REGION WHICH IS SHORT CIRCUITED WITH THE SUBSTRATE THROUGH SAID REGION

This is a continuation of application Ser. No. 913,860 filed June 8, 1978 and now abandoned.

BACKGROUND OF THE INVENTION

1. Field of the Invention

The present invention relates to a Metal-Insulator-Semiconductor (MIS) type semiconductor device including an insulated gate field effect transistor (IG FET), in which the ohmic contact with the semiconductor substrate is provided on the surface of the semiconductor chip, and to a semiconductor integrated circuit comprising such a semiconductor device, as well as to a process for producing such a semiconductor device.

The term semiconductor chip used herein designates a semiconductor integrated circuit which is included in a semiconductor wafer.

The term semiconductor wafer used herein designates a piece of a semiconductor single crystal on which the various elements of a semiconductor integrated circuit are produced.

The term semiconductor substrate used herein designates a piece of a semiconductor single crystal.

2. Description of the Prior Art

In most of the semiconductor devices which include an N channel, Si-gate-MIS field effect transistor, the ohmic contact is provided on the backside of the semiconductor substrate, i.e. the backside of the semiconductor chip. Since the MIS transistor includes a thick field insulating film on the top part of the semiconductor wafer, it is necessary to form a window in the thick insulating film, in order to employ a conventional electrode structure for the ohmic contact in the MIS transistor. The formation of the electrode therefore causes the production of the semiconductor wafer to become considerably complicated and decreases the density of the integrated semiconductor circuit. It has consequently been difficult to provide the ohmic contact with the semiconductor substrate on the top side of the semiconductor chip.

The semiconductor integrated circuit having an MIS field effect transistor (FET) shown in FIG. 1 includes a P type silicon (Si) wafer 10. On the surface of the Si wafer 10, the N+ type regions 11 and 12 for source and drain of the MIS FET are formed. These N+ type regions are defined by the field insulating film 13, gate polycrystalline Si layer 14 and gate insulating film 15. Namely, in order to produce the N+ type regions, an N type impurity is introduced into the substrate using the Si layer 14 and the insulating films 13 and 15 as a mask. The N type impurity may be diffused into the substrate from the phospho-silicate glass (PSG) film 16 on the wafer so as to form the N+ type regions 11 and 12. In electrode windows of the PSG film 16 on the N+ type regions 11 and 12, a source electrode 17 and a drain electrode 18, which are usually composed of aluminum (Al) layers, are formed and ohmically contacted with the source region 11 of the drain region 12, respectively.

In such an MIS type integrated circuit, the back gate bias technique is very important for attaining the desired characteristics of the MIS FET. The back gate bias means a backward bias of PN junctions between the P type region of the substrate 10 and the N+ type regions of source and drain 11 and 12, which is achieved by an application of a predetermined amplitude of negative voltage to the P type region of the substrate 10 against the source region 11. In a P channel type MIS FET, of course, the polarity of the bias voltage is just the opposite of the above-mentioned relationship. The back gate bias provides an increase of the gate threshold voltage (Vth) of the MIS FET and a decrease of the capacitance of the PN junction between the P type Si substrate and the N+ type regions, which capacitance impedes the operating speed of the integrated circuit.

According to the prior art, a substrate electrode 19 for applying a back gate bias is generally formed on the backside surface of the substrate 10 because it is difficult to form a contact window in the PSG film 16 and the thick field insulating film 13, and to form the substrate electrode in the window. When the substrate electrode is formed on the backside surface of the substrate, it is difficult to produce the package structure of the integrated circuit, and the wiring structure between the electrodes of the semiconductor chip and outer leads of the package.

Furthermore, it is sometimes desired to connect the source electrode 17 to the P type Si substrate 10 to eliminate the back gate bias effect. However, the connection between the source electrode 17 and the substrate electrode 19 is difficult to accomplish by a simple wiring and packaging structure in the prior art.

SUMMARY OF THE INVENTION

It is, therefore, an object of the present invention to provide a semiconductor device, wherein an ohmic contact with the semiconductor substrate is provided on the top surface of the semiconductor chip.

It is another object of the present invention to produce the ohmic contact with the semiconductor substrate and to prevent the contamination of the semiconductor substrate by the produced ohmic contact.

It is a further object of the present invention to provide a semiconductor device having ohmic contacts with both the substrate and a region having a opposite conductivity type to the substrate on the top surface of the semiconductor chip.

It is a further object of the present invention to provide a semiconductor device having a plurality of electrodes on the top surface of the substrate, some of which are ohmically in contact with the substrate and underlying regions having opposite conductivity type to the substrate, and the other of which are ohmically in contact only with underlying regions having opposite conductivity type to the substrate.

It is a further object of the present invention to provide an MIS type semiconductor device having a source electrode which ohmically contacts with both the source region and the semiconductor substrate.

It is a further object of the present invention to provide an Si gate MIS type integrated circuit having an electrode which ohmically contacts the substrate through an underlying region having a conductivity type opposite to the substrate at the top surface of the substrate.

It is yet another object of the present invention to simplify the step for the pattern formation for the ohmic contact, mentioned above.

It is a still further object of the present invention to form a reliable bonding between the ohmic contact mentioned above and the wires for connecting the ohmic contact with parts of the semiconductor device.

In accordance with the objects of the present invention, there is provided a semiconductor device which comprises:

a semiconductor substrate of a first conductivity type;

first and second regions of a second conductivity type opposite to said first conductivity type extending into said substrate from a surface of said substrate;

an insulating film covering said surface of the substrate;

first and second electrode windows, formed in said insulating film, which expose said first and second regions, respectively;

a first electrode comprising a metal layer which easily forms an alloy with said semiconductor substrate, which electrode is formed on said first electrode window and contacts said first region through said first electrode window, and;

a second electrode comprising an upper metal layer, and a lower metal layer for preventing any alloy formation between the upper metal layer and the substrate, which electrode is formed on said second electrode window and contacts said second region through said second electrode window, said first region being short circuited with said substrate due to an alloy formation between said metal layer and said substrate, whereby said first electrode is ohmically connected to said substrate.

The semiconductor device mentioned above, can be embodied so that the substrate comprises a silicon monocrystal of P type or N type and the second region composes a source or drain region of a MIS FET. The first region may be a source region of the MIS FET when the back gate bias should be eliminated in the MIS FET. The upper metal layer of the electrode preferably consists of aluminum (Al) and the lower metal layer, hereinafter referred to as the alloy preventing layer, may be composed of silicon (Si), chromium (Cr), molybdenum (Mo), tungsten (W) or titanium (Ti), but it is preferable to use an Si layer as the alloy protecting layer under the Al layer. In order to construct an N channel type MIS FET by the above-mentioned semiconductor device, a P type semiconductor substrate is used and, therefore, the first and second regions are of N type. These N type regions are formed by a process of an N type impurity introduction from the surface of the P type substrate and, therefore, the regions extend inwardly to the substrate from the surface and form a PN junction within the P type substrate.

The above-mentioned semiconductor device constructed according to the present invention is hereinafter referred to as an N channel MIS type semiconductor device with a back gate bias. In the semiconductor device with the back gate bias, the N type source and drain regions are biased to a positive potential relative to the potential of the P type substrate. Back gate bias is, as is known, a technique of applying a bias of negative electrical potential to the P type Si substrate, while the N+ type Si layer on the Si substrate is grounded. According to the back gate bias technique, the capacitance of the PN junction between the P type Si substrate and the N type Si layer, which is mentioned above and used as the drain region of the FET, is advantageously decreased, because a reverse bias is applied to the PN junction. In addition, the threshold voltage Vth of the FET is increased with the increase of the back gate bias.

In the MIS type semiconductor device with the back gate bias, the second electrode may be either a source or a drain electrode having a lower polycrystalline Si layer to impede the alloy formation between an upper Al layer and the silicon of the Si substrate. The first electrode can be used as a back gate electrode to directly contact an underlying N type region formed in a source and drain regions formation process, and the alloy between aluminum and silicon penetrates the N type region. As a result, the PN junction between the N type region and the P type substrate is partially destroyed and the first electrode is short circuited with the substrate. The upper Al layer of the second electrode is not short circuited with the Si substrate when the Al layer of the first electrode is short circuited with the Si substrate, but an ohmic contact between the second electrode and the underlying N type region is attained due to the alloy formation between the aluminum and polycrystalline silicon. Therefore, the second electrode is electrically isolated from the substrate by the underlying PN junction. Similarly, in the MIS type semiconductor device with the grounded substrate, a short circuit between the Si substrate and the upper Al layer of the drain electrode may be impeded while short circuiting between the Si substrate and the Al layer of the source electrode. Since the polycrystalline Si layer is present between the upper Al layer and the Si substrate at the second or drain electrode in the two semiconductor devices mentioned above, aluminum is diffused into the polycrystalline Si layer but substantially not into the Si substrate, although the first or source electrode is short circuited with the substrate by the alloy formation between the Al layer and the Si substrate. The Si substrate is, therefore, advantageously protected against being contaminated with aluminum at the second electrode, according to the present invention.

In addition, since the Al layer is present as the top layer of the electrodes in the semiconductor devices with the back gate bias or the grounded substrate, essentially no bubbles are formed in the top Al layer during the etching process of an Al pattern formation and, thus, it is not difficult to form an Al pattern of the electrodes. Furthermore, the top Al layer is still soft and highly corrosion resistant, although the silicon of the polycrystalline Si layer is diffused into the top Al layer during the heat treatment of the semiconductor wafer. It is therefore possible to form a reliable bonding between the bonding wires and the first electrodes, and to use a package of plastic material which can prevent the penetration of water thereinto.

The bonding wire electrically connected to the back gate electrode or the ground electrode, i.e. the second electrode, of the semiconductor device electrically leads the semiconductor substrate out of the semiconductor chip through the contacts between the bonding wire and the Al layer of the electrodes. It is, therefore, possible to package or mount the semiconductor chip in the package in such a manner that the bonding wires directly bond only the bonding pads of the semiconductor chip to the leading terminal of the package. On the other hand, in the conventional devices with the back gate electrode or with the grounded substrate, the bonding wires are connected to the die stage for carrying the base of the semiconductor substrate and for providing the electrical contact with the substrate. It is preferable, in the devices with the back gate bias or the grounded substrate, that the part of the package for fixing the semiconductor chip is electrically insulated from the chip, thereby removing the necessity for using expensive metal, such as gold, for the material of the fixing means. In these devices organic binder can be used for the fixing means. This organic binder is applied on either the base of said semiconductor chip or on a portion of said package.

In accordance with the present invention, there is provided a process for producing a semiconductor device as described hereinafter.

The aforementioned well known Si gate process is available for producing the MIS type semiconductor device according to the present invention. In order to produce an N channel MIS type semiconductor device by the Si gate process, an N type impurity is introduced into a P type substrate from the surface of the substrate through windows which are defined by a field insulating film and a gate electrode of polycrystalline Si. The N type regions for source and drain regions surrounded by the field insulating film are formed at the surface of the substrate by the impurity introduction process. An insulating film covering the gate electrode is formed on the substrate and, then, electrode windows which expose the surfaces of the N type regions are formed in the insulating film.

According to the present invention, an alloy preventing layer, which preferably consists of polycrystalline Si, is formed on the substrate so as to cover the surfaces of the N type regions in the electrode windows. Then, a part of the alloy preventing layer is removed at a surface of an N type region. An electrode to be formed on the N type region is to be short circuited with the P type substrate by an alloy formation. An electrode metal, which preferably consists of Al, is subsequently deposited on the substrate and electrodes are formed by photolithography. Consequently, at least one of the electrodes comprising the electrode metal layer directly contacts the surface of the N type region, while the others comprising the alloy protecting layer and the electrode metal layer are formed. Then, the substrate is subjected to a heat treatment in a temperature range of from 200° to 550° C., and an alloy formation between the electrode metal layer and the substrate is achieved.

Subsequently, a semiconductor chip is obtained by dicing the semiconductor wafer and a packaging process is carried out.

In the above-mentioned description, although an N channel MIS type semiconductor device is referred to, the present invention is also available for a P channel MIS type semiconductor device which includes a P channel MIS FET on an N type semiconductor substrate having P type source and drain regions.

Figure 1:
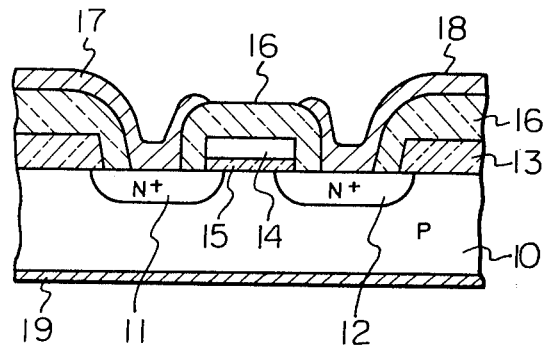
FIG. 1 illustrates the prior art as discussed above.
Figure 2:
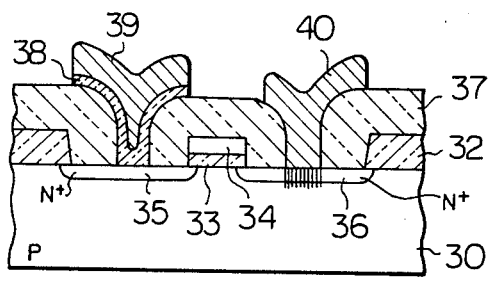
Figure 3:
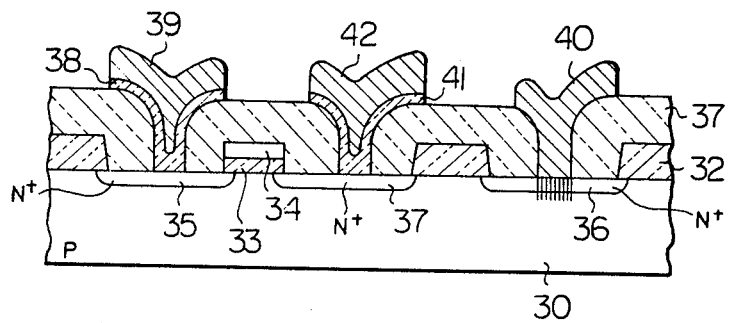
Figure 4:
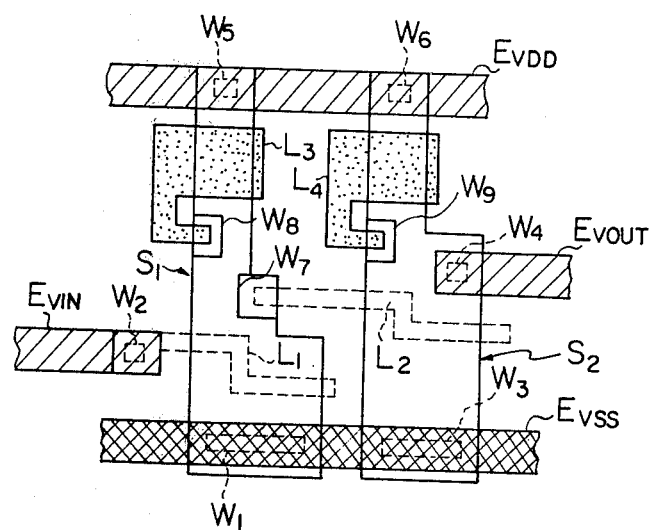
Figure 5:
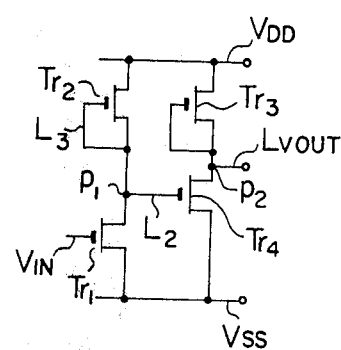
Figure 6:
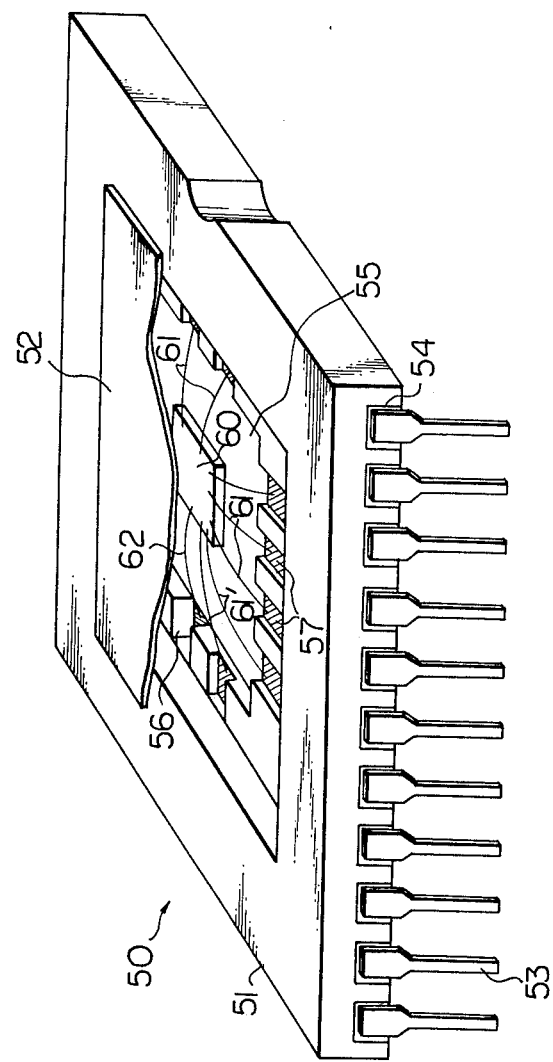

Several embodiments of the semiconductor device and process for its manufacture according to the present invention are illustrated with reference to the figures wherein:

FIG. 2 illustrates a schematic cross sectional view of the semiconductor wafer of the semiconductor device with the grounded substrate;

FIG. 3 is a drawing similar to FIG. 1 and illustrates the semiconductor wafer of the semiconductor device with a the back gate bias electrode;

FIG. 4 schematically illustrates the planar relation ships between several elements of an inverter manufactured in the semiconductor wafer; and FIG. 5 illustrates the equivalent circuit for the circuit of FIG. 4, in a semiconductor chip according to the present invention;

FIG. 6 shows a side lead type package for the semiconductor chip; and

Figure 7:
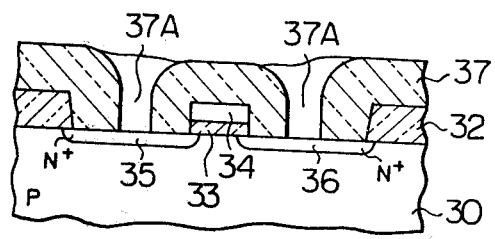
Figure 8:
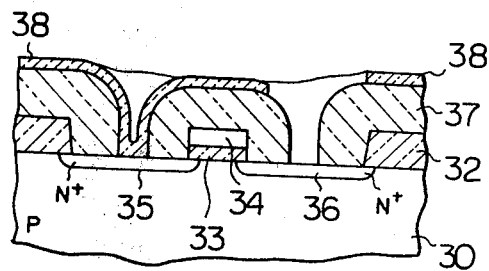
Figure 9:
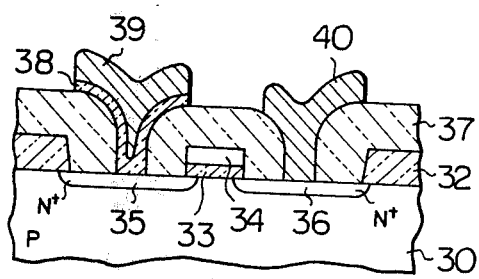

FIGS. 7, 8, and 9 show a process sequence for a device with a grounded substrate.

DESCRIPTION OF THE PREFERRED EMBODIMENTS

In FIG. 2, the semiconductor wafer comprises a P type Si substrate 30, which has an impurity concentration of from $10^{14}$ to $10^{17}/cm^3$. The N+ type regions 35 and 36 are extremely shallowly formed in the surface of the Si substrate 30 and have an impurity concentration of from $5 \times 10^{19}$ to $5 \times 10^{21}/cm^3$. The depth of the N+ type regions is from 0.1 to approximately one micron. The SiO$_2$ layer 33 having a thickness of from 300 to 1,500 angstroms is placed on the Si substrate 30 and is used as a gate insulating film 33 of the MIS FET. A polycrystalline Si layer 34 disposed between the N+ type regions 35 and 36 is placed on the gate insulating film 33 and is used as a gate electrode of the MIS FET. The SiO$_2$ film 32 for the field insulating film exposes a part of the N+ type regions 35 and 36. The phosphosilicate glass (PSG) layer 37 covers the top of the Si substrate except for the middle part of the surface of the N+ type regions 35 and 36.

According to a feature of the present invention, the non-doped or doped polycrystalline Si layer 38 is deposited on the exposed part of the N+ type layer and the PSG layer 37. When the polycrystalline Si layer 38 is doped, the dopant should be of N type, such as phosphorus or arsenic, in an amount of about $10^{21}$ per cm$^3$ of the silicon. The purpose of polycrystalline Si layer 38 is to protect the extremely shallow, N+ type layer 35 against destruction by the alloy formation between the Al layer 38 and the Si substrate 30 during heat treatment of the wafer. Namely, since the aluminum atoms of the Al layer 39 cannot be diffused directly into the Si substrate, and further since the diffusion rate of aluminum atoms into the polycrystalline Si layer 38 is decreased when the aluminum content in the polycrystalline silicon arrives at nearly the solubility limit of the aluminum in the silicon, the Si substrate is protected against contamination by aluminum. The silicon atoms in the polycrystalline Si layer 38 also diffuse into the Al layer 39 to the extent of the solubility limit and, thereafter, the reaction of the alloy formation does not proceed. It is preferable to select the thickness of Al layer 39 and the polycrystalline Si layer 38 so that the content of the silicon in the Al layer 39 is from 0.5 to 4 weight percent after the heat treatment. The thickness of the polycrystalline Si layer 39 should be selected from 100 to 1,000 angstrom, more preferably from 200 to 600 angstroms.

The Al layers 39 and 40 are deposited on the polycrystalline Si layer 38 and the exposed part of the N+ type Si layer 36, respectively. Although polycrystalline Si is preferable as the metal of the layers 38 and 41 (see FIG. 3), a metal selected from the group of chromium, molybdenum and tungsten can be used. Titanium may also be used, although titanium is less preferable than chromium, molybdenum and tungsten, because it is difficult for titanium to form an ohmic contact with the P type layers. The thickness of the metal layers 39 and 40 should be from 0.5 to 1.5 microns. The aluminum atoms of the Al layer 40 diffuse into the Si substrate 30, while the silicon atoms of the Si substrate 30 diffuse into the Al layer 40, during the heat treatment of the wafer. The silicon-aluminum alloy is, therefore, formed from the substrate surface to beneath the N+ type region 36.

The N+ type source region 36 is, therefore, short circuited with the substrate due to the reaction of the alloy formation and the electrode 40 is brought into the ohmic contact with the Si substrate 30. The electrode 39 is protected from being short circuited by the protecting film 38 and is electrically isolated from the substrate 30 by the underlying PN junction between the N+ type region 35 and the substrate. During the above-mentioned heat treatment, the electrode 39 is brought into the ohmic contact with the N+ type region 35.

In FIG. 3 wherein the same member as in FIG. 2 is denoted by the same number, the electrode of the N+ type drain region consists of the upper Al layer 42 and the lower polycrystalline Si layer 41 for preventing the alloy formation mentioned above. The back gate electrode 40 consists of the metal, as mentioned above, which is ohmically connected to the substrate 30.

As an example of a specific circuit, an integrated circuit having a pair of inverter circuits in cascade connection, which is constructed of MIS FETs according to the present invention, is described hereinafter with reference to FIG. 4 and FIG. 5. The circuit illustrated in FIG. 5 is produced in a planar relationship between the elements thereof as shown in FIG. 4. The sections $S_1$ and $S_2$ indicate the areas in which windows of the $SiO_2$ layer 32 are formed on the Si substrate. The MIS FET shown in FIG. 2 is used as the transistor $Tr_1$, the source region of which transistor $Tr_1$ is grounded to the line $E_{VSS}$ through a window $W_1$ formed in the PSG film 37 (FIG. 2). The metal wire layer $E_{VSS}$ of the source electrode 40 (FIG. 2) is extended on the PSG layer 37 (FIG. 2) of the semiconductor wafer and is brought into contact with the source region through a window $W_1$. Referring now to FIG. 2, the source electrode 40 is ohmically connected to both the source region 36 and the P type substrate 30. In this semiconductor device with the grounded substrate, the ground potential $V_{SS}$ applied to the source region and the electrical potential $V_{SUB}$ of the Si substrate is the same, and therefore, the single metal wire layer $E_{VSS}$ can be used for both the ground potential and the electrical potential applied to the Si substrate. It is, accordingly, possible to decrease the number of wiring layers or bonding wires (not shown in FIGS. 3 and 4). The metal wire layer $E_{VIN}$ is brought into contact with the polycrystalline Si layer $L_1$ of the gate electrode, which layer $L_1$ is exposed by the window $W_2$ formed in the PSG layer 37. One end of the polycrystalline Si layer $L_2$, which functions as the gate electrode of the transistor $Tr_4$ in the window $S_2$, is contacted with the drain region of the transistor $Tr_1$ through the window $W_7$.

The drain region of the transistor $Tr_1$ also functions as a source region of the transistor $Tr_2$.

Each of the transistors $Tr_2$ and $Tr_3$ is of a type of MIS FET as shown in the lefthand side of FIG. 3, and the source and gate of the transistor $Tr_2$ are connected to each other by the Si layer $L_3$. One end of this layer $L_3$ is connected to the source region of the transistor $Tr_2$, through a window $W_8$. The transistor $Tr_3$ has a structure almost the same as that of the transistor $Tr_2$, but the exposed part of the source region thereof in the window $W_4$ formed in the PSG film is connected to the metal wire layer $E_{OUT}$, which functions as an output terminal of the circuit. Since polycrystalline Si layers for protecting PN junctions (not shown in FIG. 4) are disposed under the metal wire layers $E_{VDD}$ and $E_{OUT}$, these metal wire layers $E_{VDD}$ and $E_{OUT}$ are isolated from the P type substrate by the underlying PN junction.

The windows $W_7$, $W_8$ and $W_9$, through which each of the ends of the polycrystalline Si layers $L_2$, $L_3$ and $L_4$ contacts the source or drain regions, are formed in the manufacturing process of the device, but do not remain in the completed integrated circuit. This manufacturing technique is disclosed in the specification of the U.S. Pat. No. 3,699,646.

The transistor $Tr_4$ also has the structure as shown in FIG. 2 and the exposed part of the source region thereof is connected to the metal wire $E_{VSS}$. The drain region of the transistor $Tr_4$ also functions as the source region of the transistor $Tr_3$. Each of the drain regions of the transistors $Tr_2$ and $Tr_3$ is partly exposed by the windows $W_5$ and $W_6$ formed in the PSG film 37, respectively, and is connected to the single metal wire layer $E_{VDD}$, which provides a voltage $V_{DD}$ for supplying electric power to a drain.

In the integrated circuit with the back gate bias, a polycrystalline Si layer is disposed under the metal wiring layer $E_{VSS}$, $E_{VDD}$ and $E_{VOUT}$ in the all of the windows $W_1$, $W_3$, $W_4$, $W_5$ and $W_6$. Each of these windows exposes the underlying source or drain regions so that each of the transistors $Tr_1$, $Tr_2$, $Tr_3$ and $Tr_4$ is provided with a structure of the MIS FET shown in FIG. 3 and, further, at least one back gate electrode 40, as shown in FIG. 3, is formed on the substrate. The back gate electrode is supplied with a predetermined negative potential relative to that of the metal wire layer $E_{VSS}$. Namely a back gate bias voltage is supplied to the back gate electrode, which provides a higher gate threshold voltage Vth of each of the transistors relative to that in the above-mentioned integrated circuit with the grounded substrate.

In FIG. 5, the transistor $Tr_1$ is an MIS FET functioning as a driver, and the transistor $Tr_2$ is an MIS FET functioning as a load. The source terminal and the gate terminal of the MIS FET $Tr_2$ are connected to one another and are also connected to the drain of the MIS FET $Tr_1$. In addition, the connection point $P_1$ is connected to the gate terminal of the MIS FET $Tr_4$. The transistor $Tr_3$ is a MIS FET functioning as a load of the MIS FET $Tr_4$. The output terminal of the output voltage $V_{OUT}$ is lead out from the connection point $P_2$.

In FIG. 6, a side lead type-package and the semiconductor chip provided with the bonding wire 62 according to the present invention are illustrated. The semiconductor package generally indicated by 50 comprises the package body 51, which consists of a ceramic material, and a cover 52. The ceramic material is usually $Al_2O_3$ and the like. The outer leads 53 are fixed to the package body 51 through a glazing pad 54, and consist of, for example, the Au- or Ni-plated Kovar.

The semiconductor chip 60 is mounted on the die stage 55 of the package. Since the ohmic contact with the semiconductor substrate of the chip 60 is not provided on the back side of the semiconductor chip 60, it is advantageously possible not to provide the electrical contact between the semiconductor chip 60 and the die stage 55. Consequently, a conventional gold lead, which is formed on the die stage for the electrical contact mentioned above, is not required and the structure of the package is simplified.

The bonding wire 62, for electrically connecting the semiconductor substrate to one of the outer leads 53, is directly bonded on the pad (not shown) of the metal wiring layer $E_{VSS}$ formed on the top surface of the semiconductor chip 60, and electrically leads the pad (FIG. 4) to the inner lead 56 formed in the package body 21. Namely, this pad and the inner lead 56 can be connected without using the conventional gold-plated sheet on the die stage 55. Since the bonding lead wire 56 was conventionally connected at one end with the gold-plated sheet on the die stage 55, the bonding procedure relating to the conventional package was complicated and expensive. On the other hand, because all of the leading terminals are located on top of the chip at the same level, the bonding process according to the invention is simplified and brings about a cost reduction.

The bonding wires 61 electrically connect the other elements on the semiconductor chip to the inner leads 57 of the package body 51. The inner leads 57 are formed in the grooves formed on the inner circumferential part of the package body 51. The inner leads 57 and the leads 56 consist of the metallized layer and the Au- or Ni-plated layer, which is applied on the metallized layer. The lead 56 for the wire 62 is shown in FIG. 6 at a lower level than the inner lead 57, however, both leads 56 and 57 can be at the same level.

Instead of the above-mentioned ceramic package, a well known plastic package is also available for the semiconductor device according to the present invention, wherein the semiconductor chip is encapsulated with a plastic material of a silicone resin, an epoxy resin or the like by a molding process.

A process for producing a wafer according to the present invention will now be described in detail with reference to FIGS. 7 through 9, which show an embodiment of the semiconductor wafer used in the semiconductor device with the grounded substrate. In FIGS. 7 through 9, there is illustrated an example for producing the semiconductor wafer, which includes an N channel silicon gate type MIS FET. The parts of the wafer which are also illustrated in FIG. 2 are denoted by the same reference numerals in these figures.

At first, a conventional silicon gate process is carried out and a gate electrode consisting of polycrystalline silicon and N+ type regions for source and drain are formed in a P type Si wafer. According to the silicon gate process, the N+ regions are defined by a field insulating film 32 and the gate electrode 34. This silicon gate process can be carried out in the same manner as described in the aforementioned specification of U.S. Pat. No 3,699,646.

A PSG film 37 (FIG. 7), covering the gate electrode 34 and N+ type regions 35 and 36 for source and drain, respectively, is deposited on the entire surface of the wafer, and then, the electrode windows 37A are formed in the PSG film 37 by the conventinal technique. The PSG film can be used as a diffusion source for forming the N+ type regions for source and drain by phosphorous diffusion therefrom, and can be deposited by means of a conventional chemical vapor deposition (CVD) technique. The polycrystalline Si layer 38 is formed on the top of the Si wafer shown in FIG. 7. The polycrystalline Si layer 38 can be deposited by a chemical vapor deposition (CVD) method by using an $SiH_4$ gas and the like, so as to thoroughly mix the silicon of the Si layer 38 with the aluminum of the Al layers 39 during the heat treatment, explained in connection with FIG. 9. It is important that the polycrystalline Si layer have almost the same thickness over the entire deposited position thereof, even above the N+ type region 35. The polycrystalline Si layer 38 should be deposited to a thickness of from 200 to 600 angstroms. The polycrystalline Si layer 38 is selectively removed and is left on the N+ type region 35 and the proximity thereof.

The metal layer of the first and second electrodes 39 and 40, respectively, is deposited on the top of the wafer illustrated in FIG. 8. When the aluminum is used, the aluminum is deposited by vacuum evaporation or sputtering. The metal layer is selectively removed by conventional photolithography, so as to form the Al layer 39 of the first electrode and the second Al electrode 40. The Al layer 39 or electrode 40 are then used as a mask for removing the exposed, unnecessary part of the polycrystalline Si layer 38. This selective removal the Si layer 38 is carried out by, preferably, a plasma etching.

The semiconductor wafer of FIG. 9 is then heated to a temperature from 200° to 550° C., preferably 450° C., and as a result, the second Al electrode 40 is short circuited through the N+ type region 36 to the P type Si substrate 30, while the N+ type region 35 is protected by the polycrystalline Si layer 38 against a penetration of the aluminum into the substrate 30. During the heat treatment of the Si wafer, a reliable, reproducible ohmical contact can be formed between the Al layer 39 and polycrystalline layer 38.

Although the process for producing the semiconductor device with the grounded substrate has been described in connection with FIGS. 7 through 9, it is obvious that a similar process can be applied for the semiconductor device with the back gate bias.

An embodiment of the process for producing the semiconductor chip is described in detail with reference to FIG. 4. In FIG. 4, the electrode windows $W_1$ through $W_6$ are formed in the PSG film by means of a conventional photolithographic process. The metal wire layers $E_{VDD}$, $E_{VIN}$, $E_{VOUT}$ and $E_{VSS}$ are formed with the Al layer 39 or 40 on the PSG film. After the semiconductor wafer is provided with the metal wiring layers as illustrated in FIG. 4, the wafer is scribed and cracked into the semiconductor chips. Since an Al bonding wire is connected to the upper Al layer 39 containing a minute amount of the silicon which is diffused from the underlying polycrystalline Si layer, the bonding between the Al bonding wire and the Al layer 39 is very reliable.

An embodiment of the process for mounting a semiconductor chip in the package will now be described in detail with reference to FIG. 6. The scribed chip 60 is fixed on the die stage 55 of the package 50. The scribed chip 60 can be fixed by means of a conventional metal sheet or layer, which is placed between the semiconductor chip 60 and the die stage 55 and which is bonded therebetween by a thermal bonding. However, it is advantageous to directly bond the semiconductor chip 60 to the die stage 55 by means of a non metallic binder.

The wires 61 and 62 are then bonded by an ultrasonic or thermal bonding method between the leading terminals of the semiconductor chip 60 and the inner terminals 56 and 57 of the package. Since the wire 62 can be drawn from a leading terminal, i.e. a bonding pad, formed on the top of the semiconductor chip 60, it is possible to considerably simplify the bonding process and, thus, to reduce the production cost of the semiconductor device. It is also possible to use one type of package for a large number of types of semiconductor chips, although in the conventional semiconductor device, the types of semiconductor chips mounted in one type of package were limited when the lead was to be connected to the other side of the substrate.

Although the side lead type-package is illustrated in FIG. 6, types of packages other than the side lead type can be used in the present invention.

The typical physical characteristics of the semiconductor device and the process conditions for producing the same are as follows.

The impurity concentration of the P type Si substrate 30 is $1 \times 10^{16}/cm^3$.

The thickness of the N+ type region 35 through 37 is 0.3 through 0.5 micron.

The impurity concentration of the N+ type region 35 through 37 is $5 \times 10^{20}/cm^3$.

The thickness of the polycrystalline Si layer 34 is 0.4 micron.

The thickness of the field SiO$_2$ layer 32 is one micron.

The thickness of the polycrystalline Si layer 38 is 400 angstroms.

The thickness of the Al layers 39 and 40 is one micron.

The thickness of the PSG layer 37 is one micron.

The CVD of the polycrystalline Si 38 is carried out by heating SiH$_4$ at a temperature from 600 to 800° C.

The deposition of aluminum is by vacuum evaporation at 1,500° C. under a reduced pressure of $10^{-7}$ Torr.

The heat treatment is carried out at 450° C. for one half hour.

What is claimed is:

1. A semiconductor device which comprises:
   a semiconductor substrate of a first conductivity type;
   first and second regions of a second conductivity type opposite to said first conductivity type extending into said substrate from a surface of said substrate;
   an insulating film selectively covering said surface of the substrate including said first and second regions, said insulating film having first and second electrode windows to selectively expose said first and second regions, respectively;
   a first electrode, comprising a metal layer which forms an alloy with said semiconductor substrate, formed to contact said first region through said first electrode window, and to form a short circuit with said substrate through said first region as a result of formation of said alloy;
   a second electrode, comprising an upper metal layer and a lower metal layer for preventing an alloy formation between said upper metal layer and said substrate, formed to contact said second region through said second electrode window;
   whereby said first electrode is ohmically connected to said substrate.

2. A semiconductor device according to claim 1, wherein said substrate comprising silicon.

3. A semiconductor device according to claim 1, wherein said insulating film comprising phospho-silicate glass.

4. A semiconductor device according to claim 1, wherein said metal layer for preventing the alloy formation consists of a metal selected from the group comprising silicon, chromium, molybdenum, tungsten and titanium.

5. A semiconductor device according to claim 1, wherein said upper metal layer comprising aluminum.

6. A semiconductor device according to claim 5, wherein said upper metal layer has a thickness of from 0.5 to 1.5 microns.

7. A semiconductor device according to claim 5, wherein said layer for preventing the alloy formation comprises silicon.

8. A semiconductor device according to claim 7, wherein said alloy preventing layer has a thickness of from 100 to 1,000 angstroms.

9. An MIS type semiconductor device having a field effect transistor and comprising:
   a semiconductor substrate of a first conductivity type;
   source and drain regions of the transistor formed in and at the surface of said substrate, each being of a second conductivity type opposite to said first conductivity type;
   an insulating film selectively covering said substrate and said source and drain regions, said insulating film having source and drain electrode windows selectively exposing a part of each of said source and drain regions, respectively;
   a source electrode formed to contact said source region through said source electrode window and to form a short circuit with said substrate through said source region, said substrate and said source electrode comprising materials capable of forming an alloy to achieve said short circuit; and
   a drain electrode formed to contact said drain region through said drain electrode window, said drain region being electrically separated from said substrate by a PN junction that forms between said drain region and said substrate as a result of the different conductivity types.

10. An MIS type semiconductor device having a field effect transistor which comprises:
    a semiconductor substrate of a first conductivity type;
    source and drain regions of the transistor formed in and at the surface of said substrate, each being of a second conductivity type opposite to said first conductivity type;
    another region of said second conductivity type formed in said substrate apart from said source and drain regions;
    an insulating film selectively covering said substrate including said regions with a plurality of windows respectively exposing each of said regions;
    source and drain electrodes respectively contacting said source and drain regions through the respective windows, each of said source and drain electrodes being electrically separated from the substrate by the respective PN junctions that form between said source and drain regions and said substrate as a result of the different conductivity types; and
    a back gate electrode formed in the respective other window to contact said other region and to form a short circuit with said substrate, said back gate electrode and said substrate comprising materials capable of forming an alloy between said back gate electrode and said substrate to achieve said short circuit.

11. A semiconductor integrated circuit having a field effect transistor which comprises:
    a semiconductor substrate of a first conductivity type;
    source and drain regions of the transistor formed in and at a surface of said substrate, each of said regions being of a second conductivity type opposite to said first conductivity type;
    a gate electrode for the gate of the transistor disposed between said source and drain regions;
    an insulating film selectively covering said surface of said substrate with windows for source and drain electrodes formed in said insulating film, each of said windows selectively exposing said source and drain regions, respectively;
    a source electrode comprising a metal layer formed to contact said source region through said source electrode window, said metal layer being of a material capable of forming an alloy with said substrate, said metal layer being ohmically connected to said substrate by a short circuit due the alloying between said metal layer and said substrate; and a drain electrode, comprising an upper metal layer formed and a lower metal layer for preventing an alloy formation of said upper metal layer with said substrate, said drain electrode ohmically contacting said drain region through said drain electrode window, and said drain electrode being electrically separated from said substrate by a PN junction that is formed between said drain region and said substrate as a result of the different respective conductivity types.

12. A semiconductor integrated circuit having a field effect transistor which comprises:

a semiconductor substrate of a first conductivity type;

source and drain regions of the transistor formed in and at the surface of said substrate, each of said regions being of a second conductivity type opposite to said first conductivity type;

a further region of said second conductivity type formed in said substrate apart from said source and drain regions;

an insulating film selectively covering said surface of said substrate to form electrode windows respectively corresponding to said regions, each of said electrode windows exposing a part of the respective one of said regions;

source and drain electrodes, each of which comprises a lower layer for preventing an alloy formation with said substrate and a metal layer thereon, said electrodes being formed to contact the source and drain regions through the respective electrode windows, each of said source and drain electrodes being electrically separated from said substrate by respective PN junctions that form between said source and drain regions and said substrate as a result of said different conductivity types; and a back gate electrode comprising said metal layer to make ohmic contact with said further region and to said substrate by a short circuit due to an alloy formation between said metal layer and said substrate, said metal layer and said substrate comprising materials providing for said alloy formation.

13. A semiconductor integrated circuit according to claim 11 or 12, wherein said lower metal layer preventing the alloy formation comprises a metal selected from the group of silicon, chromium, molibdenum, tungsten and titanium.

14. A semiconductor integrated circuit according to claim 11 or 12, wherein said upper metal layer comprises aluminum.

15. A semiconductor integrated circuit according to claim 11 or 12, wherein said lower metal layer preventing the alloy formation comprises silicon.

16. A semiconductor integrated circuit according to claim 11 or 12, wherein said upper metal layer has a thickness of from 0.5 to 1.5 microns and said lower metal layer preventing the alloy formation has a thickness of from 100 to 1,000 angstroms.

17. A semiconductor integrated circuit according to claim 11 or 12, wherein said gate electrode comprises polycrystalline silicon.

18. A semiconductor integrated circuit according to claim 11 or 12 comprising a field insulating film covering a surface of said substrate and surrounding said source and drain regions.

19. The device of claim 1, 9 or 10, said region through which said alloying occurs having a depth from the surface of said substrate in the range from 0.1 to 1 microns.

20. The device of claim 1, 9 or 10, the respective electrode and said substrate between which said alloying occurs comprising materials to provide said alloying when treated at a temperature in the range from 200° to 550° C.

21. The device of claim 1, said device comprising an N channel MIS type transistor, and said substrate having P type conductivity.

22. The device of claims 9 or 10, said field effect transistor comprising an N channel MIS type transistor, and said substrate having P type conductivity.

23. The circuit of claims 11 or 12, said region through which said alloying occurs having a depth from the surface of said substrate in the range from 0.1 to 1 microns.

24. The circuit of claims 11 or 12, the respective electrode and said substrate between which said alloying occurs comprising materials to provide said alloying when treated at a temperature in the range from 200° to 550° C.

25. The circuit of claims 11 or 12, said field effect transistor comprising an N channel MIS type transistor, and said substrate having P type conductivity.

* * * * *

UNITED STATES PATENT AND TRADEMARK OFFICE
CERTIFICATE OF CORRECTION

PATENT NO. : 4,271,424

DATED : June 2, 1981

INVENTOR(S) : Inayoshi et al.

It is certified that error appears in the above—identified patent and that said Letters Patent is hereby corrected as shown below:

Front Page, [75] Inventors, the inventors' cities of residence "Hiyoshi" and "Edamachi" should both be --Yokohama--;

[73] Assignee, "Tokyo" should be --Kawasaki--;

[56] References Cited, "London" should be --London et al.--;

[57] Abstract, line 10, delete ",".

Column 2, line 43, "having a" should be --having an--;

line 52, after "having" insert --an--;

line 59, "an Si" should be --a Si--.

Column 3, line 18, ", and;" should be --; and--;

line 19, delete ",";

line 29, delete ",";

line 40, "an Si" should be --a Si--.

Column 5, line 39, "C." should be --C--;

line 52, ";" should be --.--;

line 57, "cross sectional" should be --cross-sectional--;

line 62, delete "the";

line 63, "relation" should be --relation- --;

line 67, delete ",".

Column 6, line 52, "angstrom," should be --angstroms,--.

UNITED STATES PATENT AND TRADEMARK OFFICE
CERTIFICATE OF CORRECTION

PATENT NO. : 4,271,424
DATED : June 2, 1981
INVENTOR(S) : Inayoshi et al.

It is certified that error appears in the above—identified patent and that said Letters Patent is hereby corrected as shown below:

Column 7, line 3, "into the" should be --into--;
         line 10, "the ohmic" should be --ohmic--.
Column 8, line 20, "in the" should be --in--;
         line 29, after "Namely" insert --,--;
         lines 34 and 35, "is an" should be --is a--;
         line 52, delete "the".
Column 9, line 22, "well known" should be --well-known--;
         line 49, "then," should be --then--;
         line 50, "conventinal" should be --conventional--;
         line 53, "rous" should be --rus--;
         line 60, "layers" should be --layer--;
         line 68, after "and" insert --in--.
Column 10, line 3, "When the" should be --When--;
         line 8, "are" should be --is--;
         line 10, after "removal" insert --of--;
         line 13, both occurrences of "C." should be --C--;
         line 20, after "and" insert --the--;
         line 51, "non metallic" should be --nonmetallic--.
Column 11, lines 20 and 21, "C." should be --C--;
         line 48, 50, and 59, "comprising" should be --comprises--;

UNITED STATES PATENT AND TRADEMARK OFFICE
CERTIFICATE OF CORRECTION

PATENT NO. : 4,271,424

DATED : June 2, 1981

INVENTOR(S) : Inayoshi et al.

It is certified that error appears in the above—identified patent and that said Letters Patent is hereby corrected as shown below:

```
              line 53, "the" should be --said--;
              line 54, "consists of" should be --comprises--;
    "com-" should be --con- --;
              line 55, "prising" should be --sisting of--;
              line 64, "the" should be --said--.
   Column 13, line 4, after "due" insert --to--.
   Column 14, line 1, "molibdenum" should be --molybdenum--;
              line 19, "a" should be --a portion of the--;
              lines 34, 37, 41, and 46, "claims" should be
   --claim--.
```

Signed and Sealed this

Ninth Day of February 1982

[SEAL]

Attest:

Attesting Officer

GERALD J. MOSSINGHOFF

Commissioner of Patents and Trademarks